United States Patent [19]

Takatori et al.

[11] Patent Number: 5,388,063
[45] Date of Patent: Feb. 7, 1995

[54] FILTER CIRCUIT WITH SWITCHABLE FINITE IMPULSE RESPONSE AND INFINITE IMPULSE RESPONSE FILTER CHARACTERISTICS

[75] Inventors: Sunao Takatori; Makoto Yamamoto, both of Tokyo, Japan

[73] Assignee: Yozan Inc., Tokyo, Japan

[21] Appl. No.: 154,036

[22] Filed: Nov. 18, 1993

[30] Foreign Application Priority Data

Nov. 18, 1992 [JP] Japan .................................. 4-333646

[51] Int. Cl.⁶ ........................ G06F 15/31; G06G 7/02
[52] U.S. Cl. ........................... 364/724.17; 364/724.13; 364/825
[58] Field of Search ...................... 364/724.17, 724.13, 364/724.01, 825

[56] References Cited

U.S. PATENT DOCUMENTS 4,422,156 12/1983 Sano ................................ 364/724.17
4,495,591 1/1985 Loomis, Jr. .................... 364/727.17

OTHER PUBLICATIONS

Jackson et al., "An Approach to the Implementation of Digital Filters", IEEE Trans. on Audio and Electroacoustics, Sep. 1968, pp. 413-420.
Massara, "Synthesis of Low-Pass Forms", The Electrical Engineering Handbook, Apr. 3, 1993, pp. 674-691.

Primary Examiner—Tan V. Mai
Attorney, Agent, or Firm—Cushman, Drby & Cushman

[57] ABSTRACT

A filter which can operate as a digital filter of the finite impulse response type or the infinite impulse response type using one circuit. The signal to be filtered is multiplied and added using a first calculation circuit and a second calculation circuit. The outputs of the calculation circuits are added using addition circuits. Either the output of the addition circuit or the input of the first calculation circuit is applied by a switching element to the first calculation circuit.

16 Claims, 5 Drawing Sheets

FILTER CIRCUIT WITH SWITCHABLE FINITE IMPULSE RESPONSE AND INFINITE IMPULSE RESPONSE FILTER CHARACTERISTICS

FIELD OF THE INVENTION

The present invention relates to what is called "a digital filter" which is a filter circuit for holding a plurality of successively input data items in time series and accumulating the data in time series after it has been multiplied by a multiplier.

BACKGROUND OF THE INVENTION

There are two digital filters of this type: FIR (Finite Impulse Response) type filters and IIR (Infinite Impulse Response) type filters. The digital filter of IIR-type feeds back an output to realize complicated frequency characteristics. That of FIR-type has simple structure and is widely used for low pass filtering, for example.

A digital filter is realized by DSP for applications requiring flexibility, or by special use circuit when high speed processing is necessary.

Neither filter type is able to realize both satisfactorily high speed processing and wide-usability.

SUMMARY OF THE INVENTION

The present invention solves the above conventional problems and has an object to provide a filter circuit with both of wide-usability and high speed processing.

The filter circuit of this invention realizes digital filters both of FIR-type and IIR-type using one circuit by: i) distributing the data to be summed and multiplied into the first calculation circuit and the second calculation circuit: ii) summing the outputs of the calculation circuits with addition circuits: and iii) selectively inputting either the output of the addition circuits or the input of the first calculation circuit to the second calculation circuit using switching means.

BRIEF DESCRIPTION OF THE ATTACHED DRAWINGS

PREFERRED EMBODIMENT OF THE PRESENT INVENTION

Hereinafter an embodiment of a filter circuit according to the present invention is described with reference to the attached drawings.

Figure 1:
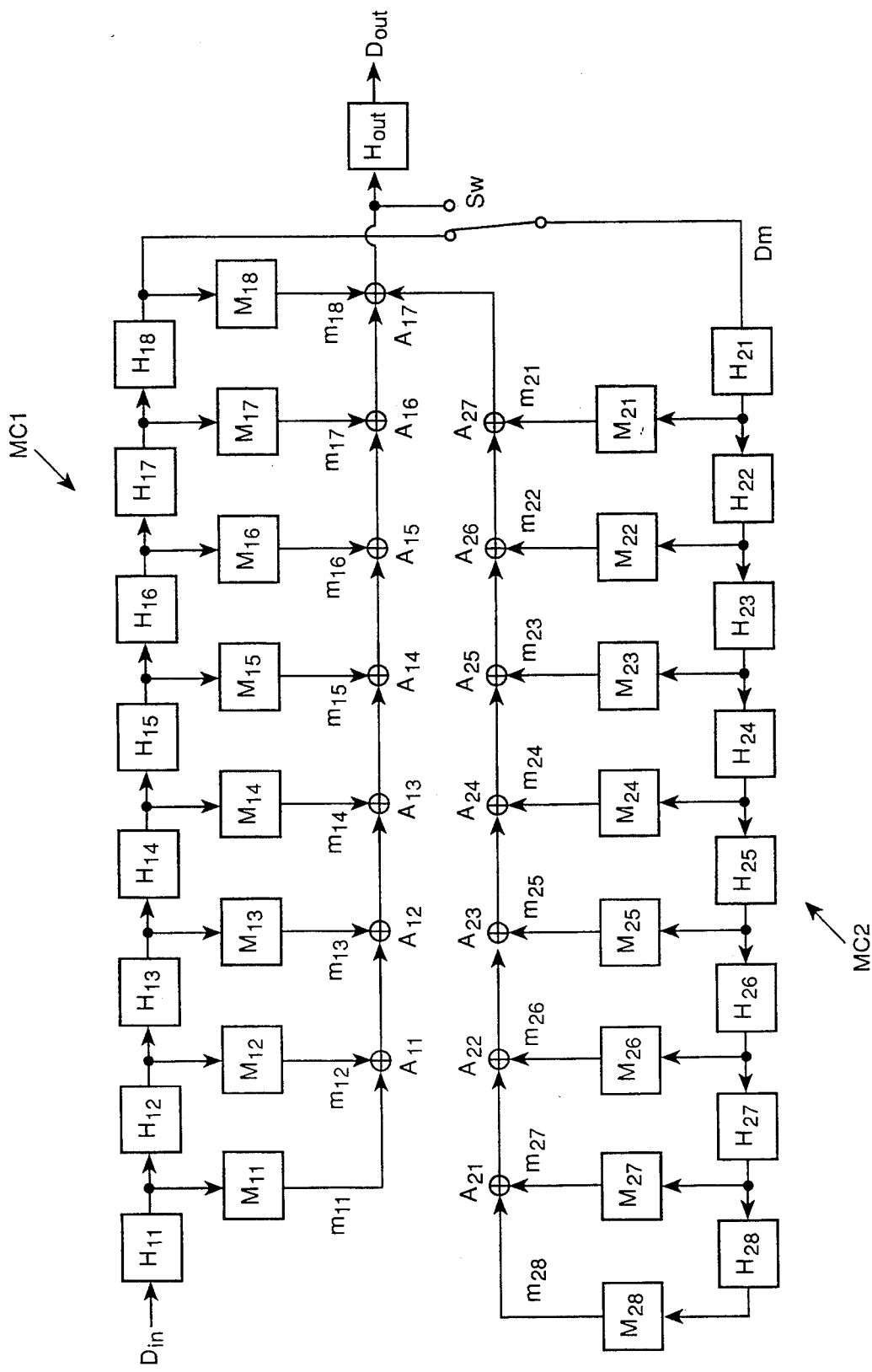
FIG. 1 shows a block diagram of the filter circuit of this invention.

In FIG. 1, the filter circuit comprises "MC1" of the first calculation circuit and "MC2" of the second calculation circuit. In "MC1" of the first calculation circuit, a plurality of holding circuits are connected in serial from "$H_{11}$" to "$H_{18}$", and an output of each holding circuit "$H_{1k}$" is input to multiplication circuit "$M_{1k}$". In MC2 of the second calculation circuit, a plurality of holding circuits are serially connected from "$H_{21}$" to "$H_{28}$", and an output of each holding circuit "$H_{2k}$" is input to multiplication circuit "$M_{2k}$".

Input data "Din" is input to MC1 of the first calculation circuit. Din is transferred to the holding circuit in the next step after once being held in each holding circuit. The time series data Din is held in each holding circuit by that holding circuit. The data in time series is expressed by "$X(t-k)$". The predetermined multipliers from "$a_1$" to "$a_8$" are input beforehand to multiplication circuits from "$M_{11}$" to "$M_{18}$", which perform multiplication below concerning to data in time series.

$$m_{1k} = a_k \times X(t-k)$$

$m_{1k}$ is a multiplied result by multiplication circuit $m_{1k}$.

The output of multiplication circuits $M_{1k}$, $M_{1(k+1)}$ are summed by addition circuit "$A_{1k}$" and the summed result is output to "$A_{1(k+1)}$" of an addition circuit in the next step. Therefore, addition circuit "$A_{17}$" calculates the total summation of the outputs of all multiplication circuits in the first calculation circuit as below.

$$\sum_{i=1}^{8} a_k \times X(t-k)$$

An output of "$A_{17}$" or "$H_{18}$" is input to the second calculation circuit as the second input data "Dm" through switch "SW". "Dm" is transferred to a holding circuit in the next step after once holding in each holding circuit from "$H_{21}$" to "$H_{28}$". The data in time series of "Dm" is held in each holding circuit by it. The data in time series is expressed by "$Y(t-k)$" here. The predetermined multipliers from "$b_1$" to "$b_8$" are input beforehand to multiplication circuits from "$M_{21}$" to "$M_{28}$", respectively, and the circuits from "$MP_{21}$" to "$M_{28}$" perform the multiplication concerning to the data in time series below.

$$M_{2k} = b_k \times Y(t-k)$$

$m_{2k}$ is a multiplication result obtained by multiplication circuit "$M_{2k}$".

The outputs of multiplication circuits "$M_{2k}$" and "$M_{2(K+1)}$" are summed by addition circuit "$A_{2k}$", and the summed result is output to addition circuit "$A_{2(k-1)}$" in the next step. Therefore, addition circuit "$A_{27}$" calculates the total summation of outputs of all multiplication circuits in the second calculation circuit as below.

$$\sum_{i=1}^{8} b_k \times Y(t\ k)$$

The output of addition circuit "$A_{21}$" is input to addition circuit "$A_{17}$" in the first calculation circuit "MC1". The output of "$A_{17}$" is the total summation of multiplication result of both "MC1" and "MC2" by it.

When "SW" is connected on the side of "$H_{18}$", "Dm" is $X(t-8)$ and the output of "MC2" is as below.

$$\sum_{i=1}^{8} b_k \times X(t-k-8)$$

This formula shows that the characteristic of FIR type filter is obtained.

When "SW" is connected on the side of "A₁₇", the input data "Dm" is expressed generally as below.

$$Dm = \sum_{i=1}^{8} a_k \times X(t-k) + \sum_{i=1}^{8} b_k \times Y(t-k)$$

$Y(t)$ is $Dm$. ($Y(t) = Dm$)

This formula shows that the characteristic of the characteristic of IIR type filter is obtained.

As above, two kinds of filters of FIR and IIR maybe realized by switching only "SW" in the special use circuit. When FIR type filter is realized, the filter performs many steps making use of all holding and multiplication circuits. A filter of wide use, as well as high speed processing can be realized.

Figure 2:
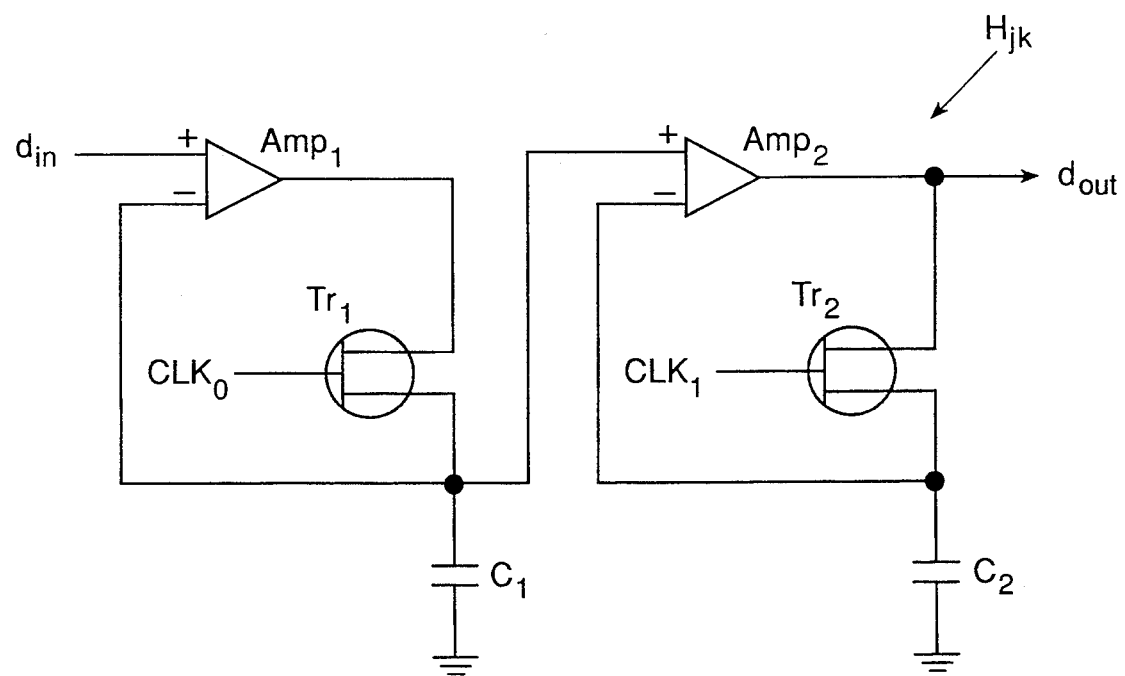
FIG. 2 shows a diagram of a holding circuit in the embodiment.

FIG. 2 shows an embodiment of holding circuit "$H_{jk}$". "$H_{jk}$" comprises a pair of operational amplifiers "$Amp_1$" and "$Amp_2$" and a pair of field of effect transistor "$Tr_1$" and "$Tr_2$". Input data "$d_{in}$" is input to the non-inverse input of "$Amp_1$". An output of "$Amp_1$" is connected to the drain of "$Tr_1$", whose source is grounded through capacitance "$C_1$" as well as fed back to the inverse input of "$Amp_1$". Clock "$CLK_0$" is input to the gate of "$Tr_1$", which becomes conductive when "$CLK_0$" is high level. When "$Tr_1$" is conductive, an output of "$Amp_1$" is controlled so that the voltage equal to "$d_{in}$" is impressed on "$C_1$", and electrical charge is stored in "$C_1$" so that the voltage for charging is "$d_{in}$".

The charged voltage of "$C_1$" is connected to non-inverse input of "$Amp_2$", whose output is connected to the drain of "$Tr_2$". The source of "$Tr_2$" is grounded through capacitance "$C_2$", as well as fed back to the inverse input of "$Amp_2$". Clock "$CLK_1$" of the inverse phase of "$CLK_0$" is input to the gate of "$Tr_2$", which becomes conductive in inverse phase of "$Tr_1$". When "$Tr_2$" is conductive, a) an output of "$Amp_2$" is controlled so that the voltage equal to "$d_{in}$" of the voltage for charging "$C_1$" is impressed on the voltage for charging "$C_2$", b) electrical charge is stored in "$C_2$" so that the voltage for charging is "$d_{in}$" by a), and c) "$d_{out}$" is output corresponding to "$d_{in}$". Holding can be surely performed by the predetermined timing because "$d_{in}$" is held in one clock timing and no influence is in the following steps when "$C_1$" is charged.

Figure 3:
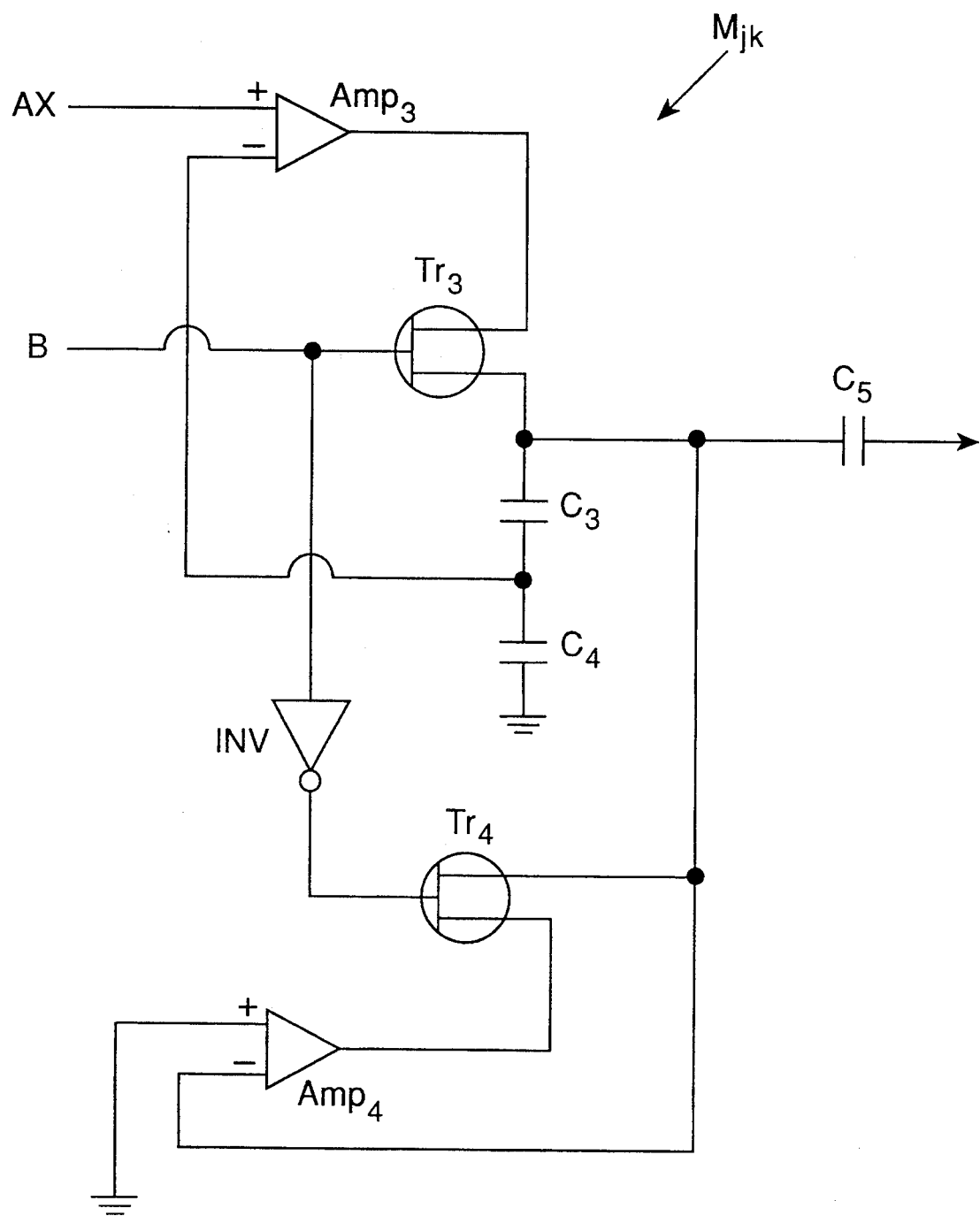
FIG. 3 shows a diagram of a multiplication circuit in the embodiment.

FIG. 3 shows an embodiment of multiplying circuit "$M_{jk}$". "$M_{jk}$" comprises a pair of operational amplifiers "$Amp_3$" and "$Amp_4$" and a pair of field of effect transistor "$Tr_3$" and "$Tr_4$". Input analog data "AX" is input to the non-inverse input of "$Amp_3$". An output of "$Amp_3$" is connected to the drain of "$Tr_3$", whose source is grounded through capacitances "$C_3$" and "$C_4$". The voltage between "$C_3$" and "$C_4$" is fed back to the inverse input of "$Amp_3$". Digital input "B" is input to the gate of "$Tr_3$", which becomes conductive when "B" is high level. When "$Tr_3$" is conductive, an output of "$Amp_3$" is controlled so that the voltage equal to "AX" is impressed on "$C_4$", and electrical charge is stored in "$C_4$" so that the voltage for charging is "AX". Here, the source voltage of "$Tr_3$" is as below.

$$AX\{(C_3-C_4)/C_3\}$$

The non-inverse input of "$Amp_4$" is grounded and an output of it is connected to the source of "$Tr_4$". The drain of "$Tr_4$" is connected to "$C_3$", as well as fed back to the inverse input of "$Amp_4$". Digital inversed "B" by inverter "INV" is input to the gate of "$Tr_4$", which is conductive when "B" is low level. When "$Tr_4$" is conductive, the output of "$Amp_4$" is controlled in order that OV is generated in the drain of "$Tr_4$".

The source of "$Tr_3$" and the drain of "$Tr_4$" is connected to "$C_5$" of the capacitance for output. The voltage value multiplied by the weight, which is determined by capacitive coupling including "$C_5$", is the output. It means that "$M_{jk}$" has performed the multiplication with output equal to the multiplier shown below or 0.

$$\{(C_3-C_4)/C_3\}C_{cp}$$

$C_{cp}$ is a weight determined by capacitive coupling.

Figure 4:
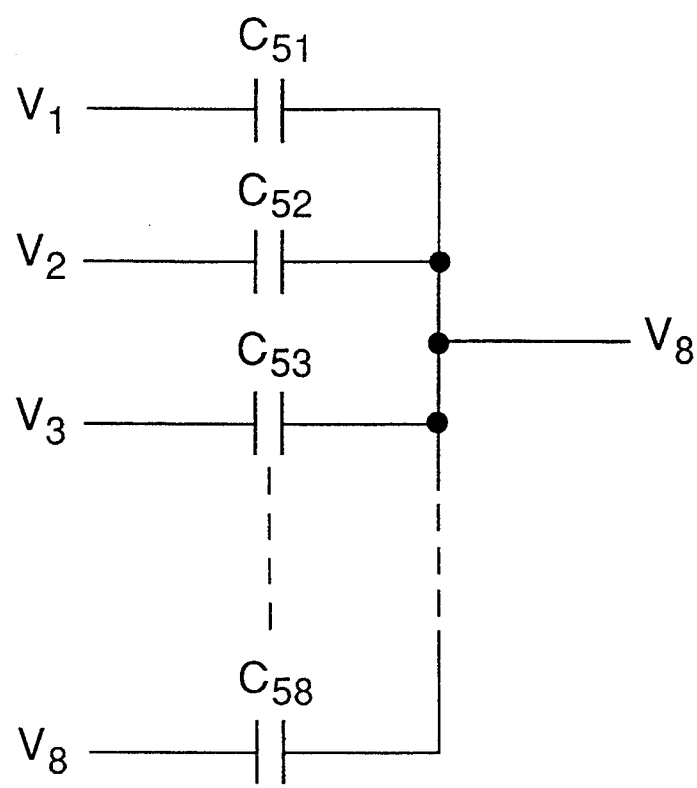
FIG. 4 shows an example of a capacitive coupling by a circuit diagram.

"Capacitive coupling" is demonstrated through the structure of FIG. 4, having a plurality of capacitances (from "$C_{51}$" to "$C_{58}$", here) connected in parallel. When voltage from "$V_1$" to "$V_8$" are impressed on these capacitances, output voltage "$V_8$" is the value calculable by the formula below.

$$V_8 = (C_{51}V_1 + C_{52}V_2 + \ldots + C_{58}V_8)/(C_1 + C_2 + \ldots C_8)$$

This formula corresponds to a condition whereby the weighted summation is executed.

The multiplication of analog data "AX" and digital data can be directly performed by orienting a plurality of circuits such as that shown in FIG. 3 in parallel, inputting each bit of digital data as "B", and setting $\{(C_3-C_4)/C_3\}C_{cp}$ to be $2^n$.

The adding circuit "$A_{jk}$" above can be realized using the basic structure in FIG. 4 by framing the inputs two or three.

The output signal "$D_{out}$" to be output by the structure of the above is once held in "$H_{out}$".

Figure 6:
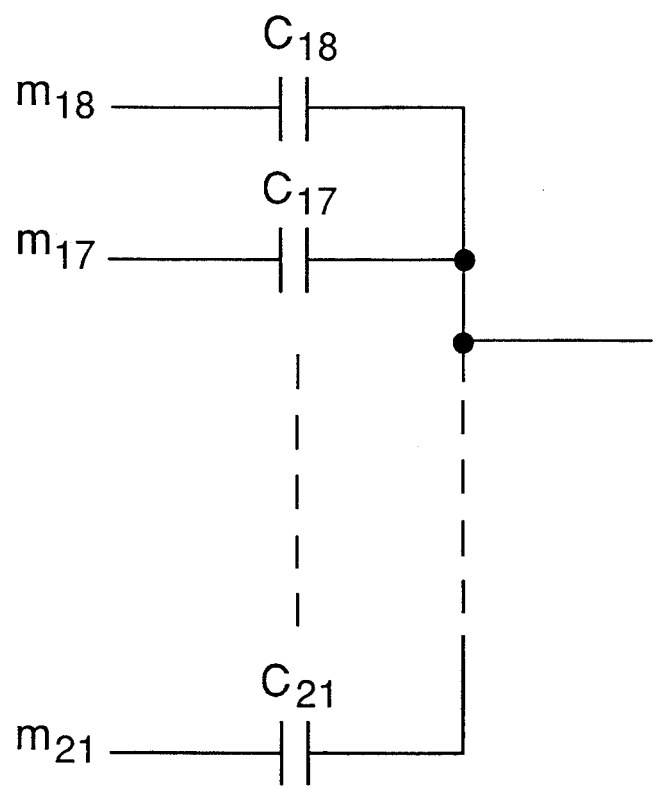
FIG. 6 shows an addition circuit in the second embodiment.
Figure 5:
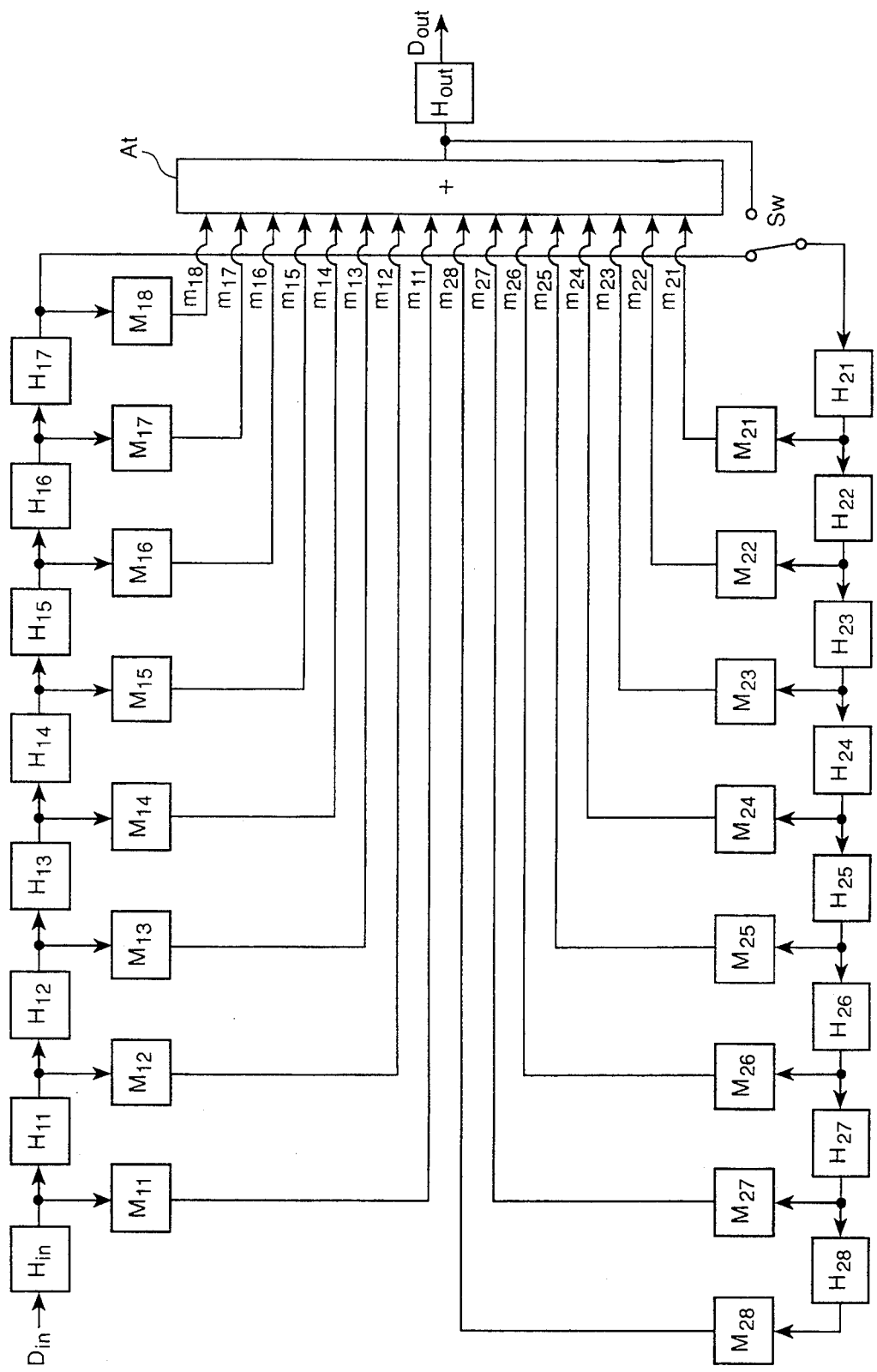
FIG. 5 shows a block diagram of the second embodiment.

FIG. 5 shows the second embodiment of this filter circuit. One addition circuit "$A_t$" is used there in lieu of addition circuit "$A_{jk}$" in FIG. 1. Assuming the output of each multiplication circuit "$M_{jk}$" to be "$m_{jk}$", as shown in FIG. 6, weighted summation is carried out by capacitive coupling in which capacitances "$C_{jk}$" are connected in parallel. The method for calculation is the same as that of the circuit in FIG. 4.

As mentioned above, the filter circuit of this invention realizes digital filters both of FIR-type and IIR-type using one circuit by the steps of: i) dividing the part to be summed the products into the first calculation circuit and the second calculation circuit; ii) summing the outputs of the calculation circuits by addition circuit; and iii) selectively inputting either the output of the addition circuit or the input of the first calculation circuit switching means to the second calculation circuit. Therefore, it is possible to process in high speed keeping wide use.

What is claimed is:

1. A filter circuit comprising:
   i) first circuit means having a plurality of first holding circuits and a plurality of first multiplication circuits, said first holding circuits for holding first input data in time series and each of said first multiplication circuits for multiplying an output of one of said first holding circuits by a first mutiplier;
   ii) second circuit means having a plurality of second holding circuits and a plurality of second multiplication circuits, said second holding circuits for holding second input data and each of said second multiplication circuits for multiplying an output of one of said second holding circuits by a second multiplier;

iii) addition means for calculating a total summation of multiplication results of said first and second circuit means; and iv) a switching circuit for inputting either an output of said addition circuit or delayed first input data as the second input data to said second circuit means.

2. A filter circuit as recited in claim 1, wherein said addition means is comprised of one addition circuit which receives outputs from all the first and second multiplication circuits.

3. A filter circuit as recited in claim 1, wherein said addition means comprises a plurality of first addition circuits and a second addition circuit, each said first addition circuit having two input terminals for receiving one multiplication result and one addition result, said second addition circuit having three input terminals for receiving one multiplication result and two addition results.

4. A filter circuit as recited in claim 1, wherein said addition means include a plurality of parallel-connected capacitors, each receiving a multiplication result or an addition result at one end, and each being connected at the other end.

5. A filter circuit as recited in claim 1, wherein at least one of a group of said first holding circuits and said second holding circuits is comprised of:
a first amplifier receiving said first input data;
a first transistor having a gate coupled with a first clock, a drain coupled with an output of said first amplifier, and a source coupled with an input of said first amplifier;
a first capacitor coupled with said source of said first transistor and ground;
a second amplifier having an input coupled with said source of said first transistor;
a second transistor having a gate coupled with a second clock, a drain coupled with an output of said second amplifier, and a source coupled with an input of said second amplifier, said second clock and said first clock are out of phase; and
a second capacitor coupled with said source of said second transistor and ground, where
said second amplifier outputs delayed first input data which is based on said first input data.

6. A filter circuit as recited in claim 1, wherein at least one of a group of said first multiplication circuits and said second multiplication circuits is comprised of:
a clock and for generating clocking signals;
an inverter for inverting said clocking signals to generate inverted clocking signals;
a first amplifier receiving input data at a first input;
a first transistor having a gate coupled with said clocking signal, a source coupled with an output of said first amplifier and a drain;
a first capacitor coupled with said drain of said first transistor;
a second capacitor coupled with said first capacitor and ground, where a potential difference between said first and said second capacitor is input to a second input of said first transistor;
an output capacitor coupled with said drain of said first transistor and said first capacitor;
a second amplifier having a first input coupled with ground and a second input coupled with said output capacitor, said drain of said first transistor and said first capacitor; and a second transistor having a gate coupled with said inverted clocking signal, a source coupled with an output of said second amplifier, and a drain coupled with said second input of said second amplifier.

7. A filter circuit claimed in claim 1, wherein a finite impulse response characteristic is realized when said switching circuit inputs said delayed first input data as second input data.

8. A filter circuit claimed in claim 1, wherein an infinite impulse response characteristic is realized when said switching circuit inputs said addition circuit output as second input data.

9. A method for generating finite impulse response characteristics and infinite impulse response characteristics using one circuit, said method including the steps of:
holding at least one first input data in time series;
multiplying each said first input data by a first multiplier to generate multiplied first input data;
holding at least one second input data;
multiplying each said second input data by a second multiplier to generate multiplied second input data;
calculating a total summation of said multiplied first input data and said multiplied second input data; and
inputting said total summation or delayed first input data as second input data.

10. A method as recited by claim 9, wherein all multiplied first input data and all multiplied second input data are summed to calculate said total summation in one addition circuit.

11. A method as recited by claim 9, wherein the step of calculating said total summation includes the steps of:
sequentially summing all multiplied first input data;
sequentially summing all multiplied second input data; and
summing said sequential sum of said first input data and said sequential sum of said second input data.

12. A method as recited by claim 11, wherein said total summation is calculated by inputting said multiplied first input data and said multiplied second input data into a plurality of parallel-connected capacitors which have commonly connected outputs.

13. A method as recited in claim 9, wherein the step of holding first input data includes the following steps:
inputting first input data to a drain of a first transistor;
triggering said first transistor to conduct using a first clock so that first transistor source is equal to said first input data;
storing said first input data from said first transistor source in a first capacitor;
inputting said stored first input data from said capacitor to a drain of a second transistor;
triggering said second transistor to conduct using a second clock so that a second transistor source is equal to said first input data from said second transistor drain, said second clock being out of phase with said first clock; and
storing said first data from said second transistor source in a second capacitor, where
said output data is delayed and based on said first input data.

14. A method as recited in claim 9, wherein one of said steps of multiplying includes the steps of:
inputting data to be multiplied to a transistor assembly;

triggering said transistor assembly with a digital signal so that said transistor assembly conducts said input data;

storing said conducted input signal, said stored signal being used as output in a capacitor;

inverting said digital signal;

triggering a second transistor assembly with said inverted digital signal; and grounding said output when said second transistor is triggered.

15. A method as recited in claim 9, wherein a finite impulse response characteristic is realized when said delayed first input data is used as second data.

16. A method as recited in claim 9, wherein an infinite impulse response characteristic is realized when said total summation is used as second data.

* * * * *